United States Patent [19]

Keller

[11] 4,398,105
[45] Aug. 9, 1983

[54] ARBITER CIRCUIT

[75] Inventor: Philip J. Keller, Fremont, Calif.

[73] Assignee: Signetics Corporation, Sunnyvale, Calif.

[21] Appl. No.: 227,514

[22] Filed: Jan. 22, 1981

[51] Int. Cl.³ .................... H03K 5/26; H03K 3/295; H03K 19/086

[52] U.S. Cl. ................................ 307/518; 307/362; 307/443; 307/471; 307/514; 328/133

[58] Field of Search ............... 328/133; 307/443, 445, 307/464, 471, 514, 362, 528, 518

[56] References Cited

U.S. PATENT DOCUMENTS

| | | | |
|---|---|---|---|
| 3,646,455 | 2/1972 | Coccagna | 328/133 |
| 3,761,739 | 9/1973 | East et al. | 307/443 X |
| 3,764,902 | 10/1973 | Rodine | 328/133 X |
| 3,983,496 | 9/1976 | Bedford et al. | 307/362 X |
| 4,093,878 | 6/1978 | Paschal et al. | 307/445 X |
| 4,339,731 | 7/1982 | Adams | 328/133 X |

*Primary Examiner*—Stanley D. Miller
*Assistant Examiner*—David R. Hudspeth
*Attorney, Agent, or Firm*—J. A. Dinardo; R. Mayer; J. Oisher

[57] ABSTRACT

An arbiter circuit includes a latch made of two cross-coupled NAND gates, one of which is a Schmitt NAND gate, a difference detector, and two output NOR gates. The output of the latch is coupled to the difference detector and to one input of the NOR gates. The NOR gates receive another input from the difference detector. The difference detector is responsive to a voltage difference that exceeds one $V_{BE}$, thereby blocking signals that originate in the latch during oscillating or metastable states of the latch, which may include rut pulses.

4 Claims, 7 Drawing Figures

ARBITER CIRCUIT

BACKGROUND OF THE INVENTION

This invention relates to digital logic circuits and more particularly to an arbiter circuit of the kind employing cross-coupled NAND gates that overcomes the susceptibility of the NAND gates to become metastable, and effectively blocks the transmission of this condition until such time as the outputs are in one of two stable states.

An arbiter circuit is used in digital logic to (a) respond to a first one of two signals that may arrive at a slight difference in time, so as to give priority to such asynchronous signals on a first come first serve basis, and (b) in the case of signals that arrive at the same instant in time, make an arbitrary decision as to which of the two signals it will respond to first.

Arbiter circuits commonly employ a latch made up of two cross-coupled NAND gates. One of the problems frequently encountered in such arbiter circuits arises from a metastable condition of the cross-coupled NAND gates where the latch output is neither HIGH nor LOW but is in an intermediate state (metastable state). This condition is usually preceded by the production in the output of the latch of what is called a "rut" pulse. A rut pulse is characterized as a narrow, zero-going or positive-going pulse which is too narrow to be effective, but wide enough to be detected in the output bus. While the probability of a metastable state existing can be reduced or the duration of the metastable state can be reduced, it is extremely unlikely that this condition can be completely eliminated. Thus it becomes necessary to provide some means whereby the rut pulses, and/or the metastable levels, when they occur, can be blocked from reaching the succeeding logic devices.

SUMMARY OF THE INVENTION

An arbiter circuit includes a latch made up of first and second cross-coupled NAND gates, with the first NAND gate coupled to a first input terminal and the second NAND gate coupled to a second input terminal. One of the NAND gates is preferably a Schmitt NAND gate. The outputs of the NAND gates are coupled to a difference detector which is responsive to a specified voltage difference, preferably about one $V_{BE}$. The output of the difference detector is fed to a first input of each of two output NOR gates which also receive a second input from the two NAND gates, respectively.

Since the difference detector responds only to input signals whose voltage difference exceeds a specified value, any signals that are produced during an oscillating or metastable state of the latch, which may include rut pulses, are blocked by the difference detector from reaching the output NOR gates.

DESCRIPTION OF THE PREFERRED EMBODIMENT

Figure 1:
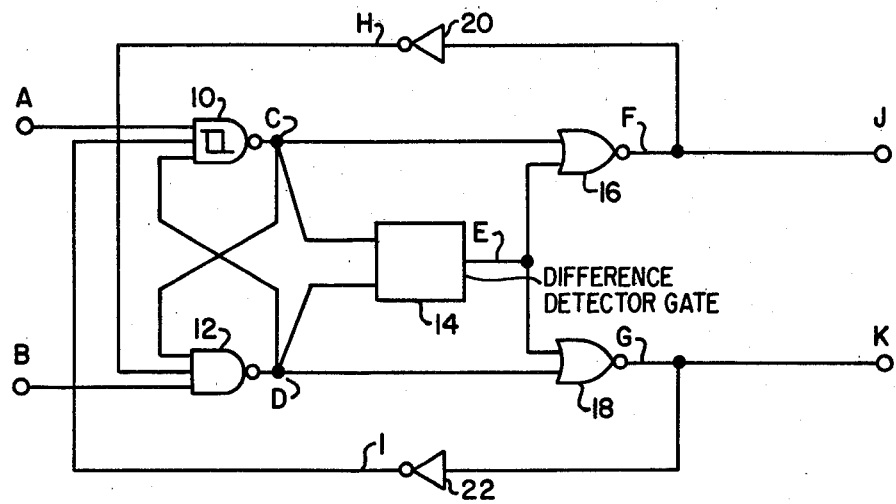
FIG. 1 is a block diagram of an arbiter circuit according to the invention.

Referring now to FIG. 1, there is shown an embodiment of the arbiter circuit according to the invention which is furnished a pair of input terminals A and B and a pair of output terminals J and K. The first input terminal A is coupled to a first input of a first NAND gate 10, preferably shown as a Schmitt NAND gate. The second input terminal B is coupled to a first input of a second NAND gate 12. The two NAND gates 10 and 12 are cross-coupled to form a latch, with the cross-coupled inputs referred to as second inputs of the latch.

The output C of the first NAND gate 10 is coupled to one input of a difference detector gate 14 and also to one input of a first NOR gate 16. The output D of the second NAND gate 12 is coupled to the other input of the difference detector gate 14 and also to one input of a second NOR gate 18. The output E of the difference detector gate 14 is coupled to the second inputs of the two NOR gates 16 and 18.

The output F of the first NOR gate 16 is coupled to the first output terminal J and the output G of the second NOR gate 18 is coupled to the second output terminal K. The output F of the first NOR gate 16 is also coupled through a first inverter 20 to a third input of the second NAND gate 12. Similarly, the output G of the second NOR gate 18 is coupled through a second inverter 22 to a third input of the first, or Schmitt, NAND gate 10. The inverted outputs, or third inputs of the NAND gates 12 and 10, are labeled H and I, respectively.

The difference detector gate 14 is designed so that its output is HIGH at all times unless its inputs differ by greater than a fixed amount, in this case greater than one $V_{BE}$. Like a conventional exclusive NOR gate, the output will be HIGH if both inputs are HIGH, or if both inputs are LOW. However, for the output to be LOW the two inputs must differ by more than one $V_{BE}$.

The operation of the arbiter circuit will now be described. In the starting condition, both inputs A and B are LOW. The output of a NAND gate is LOW only if all inputs are HIGH. Therefore, since one input of each NAND gate 10 and 12 is LOW, the outputs C and D will be HIGH and so will the cross-coupled second inputs to gates 10 and 12 be HIGH. Both inputs to the difference detector gate 14 being HIGH, the output E of the gate 14 will be HIGH. Since both inputs to the NOR gate 16 are HIGH, the output F will be LOW. Similarly, since both inputs to the NOR gate 18 are HIGH, the output G will be LOW. This is true because the output of a NOR gate will be LOW if any input is HIGH.

Since outputs F and G are LOW, the inverted inputs which go to the third inputs of NAND gates 12 and 10, respectively, are HIGH but do not affect the condition of those gates because one of their inputs is LOW.

Figure 2:
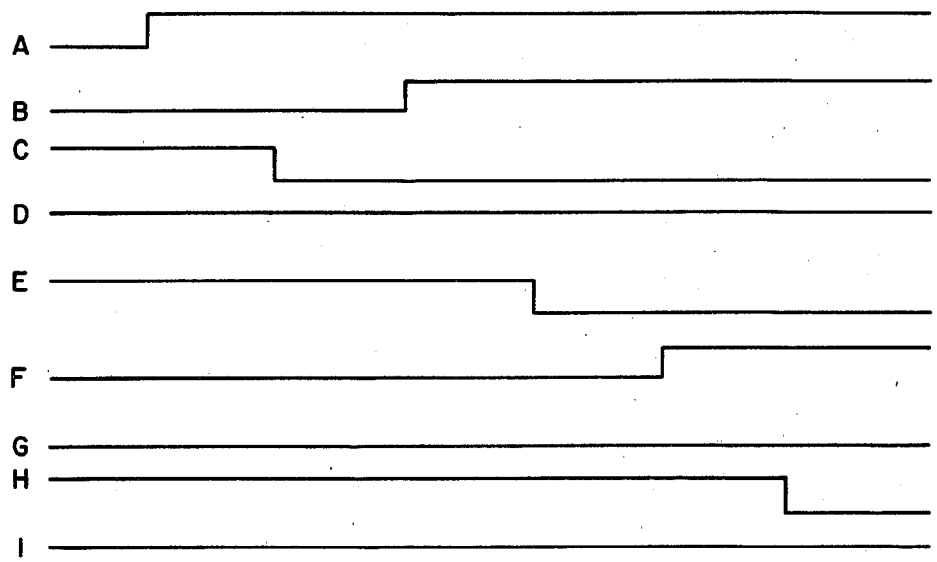
FIGS. 2-4 are graphs of waveforms useful in explaining the operation of the arbiter circuit.

The initial condition of the circuit and the waveforms that apply are those existing at the extreme left-hand portion of the waveform diagram shown in FIG. 2.

Now assume that input A goes HIGH prior to input B, as shown in FIG. 2. If A goes HIGH and B stays LOW, then C goes LOW because A and D and I, all three inputs to NAND gate 10, are HIGH. The output F of gate 16 stays LOW because C is LOW but E is HIGH. However, since C is LOW and D is HIGH the output E of gate 14 will now go LOW. Since both inputs C and E to gate 16 are LOW, F will go HIGH and the feedback inverted signal H will go LOW but will not affect the condition of input gate 12. The input E to gate 18 is LOW but input D is HIGH so output G of gate 18 will stay LOW, the output I of inverter 22 will stay HIGH and input gate 10 will not be affected. At the output terminals now, J is HIGH and K is LOW.

If B goes HIGH while A stays HIGH, the latch comprising gates 10 and 12 is not affected because the output C of gate 10 which forms the input to gate 12 remains LOW.

A similar operation will occur if input B goes HIGH and input A goes LOW because of the symmetry of the circuit, but under these conditions output terminal J will be LOW and output terminal K will be HIGH, which is just the reverse of the previously described input signal condition of A being HIGH and B being LOW.

Figure 3:
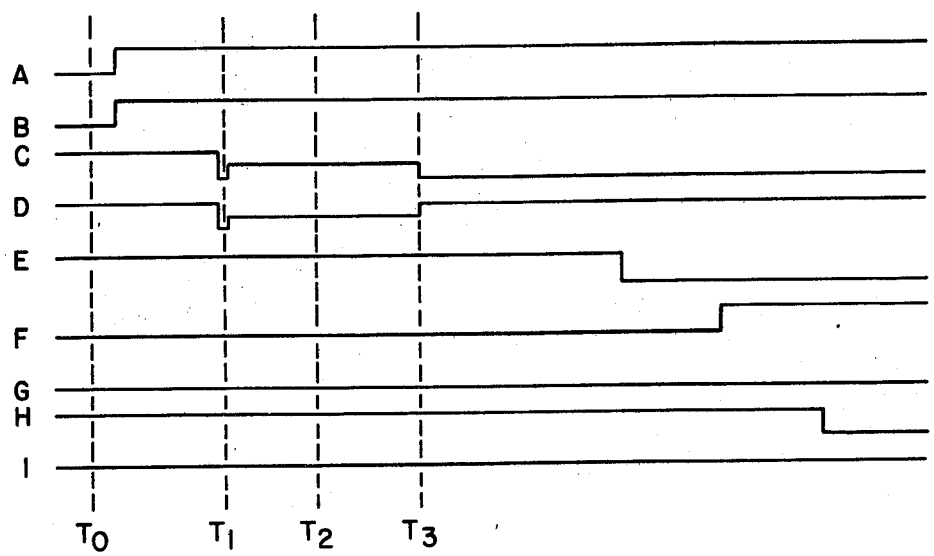

With the aid of the waveforms shown in FIG. 3, the condition will now be described where both A and B go HIGH at the same time, and this is the condition where the arbiter circuit has to make an arbitrary decision as to which one of the two inputs A or B will be given priority, that is the circuit must perform an arbitration function. Referring back to the initial state where both inputs A and B are LOW, shown at Time $T_0$, it will be recalled that C and D are HIGH, E is HIGH, and F and G are LOW. As A and B go HIGH one of the following two series of events can occur.

The first series of events that can occur is the following. At some time after A and B go HIGH, C and D go LOW. When C and D go LOW, they cause D and C, respective, to go back to HIGH, because of the cross-coupled LOW inputs to the gates 12 and 10. When D and C go HIGH their cross-coupled HIGH inputs to gates 10 and 12 will cause C and D, respectively, to go LOW again. This oscillating condition will continue until the output of one of the gates 10 or 12 remains LOW and the other gate remains HIGH.

The second series of events that can occur is the following. At some time after A and B go HIGH, shown at time $T_1$, C and D go LOW. When C and D go LOW, their cross-coupled LOW inputs to gates 12 and 10, respectively, will cause outputs D and C to go back to HIGH again, thereby producing a rut pulse on each of the outputs C and D, respectively, as shown at time $T_1$. The rut pulse that is produced on each input to gates 10 and 12 may cause the outputs C and D to go to the third state, at time $T_2$, which is metastable. This is an unstable state, and after some period of time one of the two outputs C or D will go LOW while the other output will go HIGH.

During either of the above series of events, so long as C and D do not differ by more than one $V_{BE}$, point E will remain HIGH and F and G will remain LOW. The output NOR gates 16 and 18 cannot respond to the outputs C and D, while E remains HIGH. It will be seen that during the production of the rut pulse at time $T_1$ the outputs C and D are in phase and approximately equal in amplitude. Therefore, the difference detector output E will remain HIGH, and the rut pulses will not pass through to the NOR gates 16 and 18. However, after the latch comprising gates 10 and 12 has left the metastable state and as soon as the voltage difference between C and D becomes greater than one $V_{BE}$, shown at time $T_3$, the gate 14 will respond to this difference, causing E to go LOW and thereby allowing the output NOR gates 16 and 18 to respond to the outputs C and D of the NAND gates 10 and 12.

Figure 4:
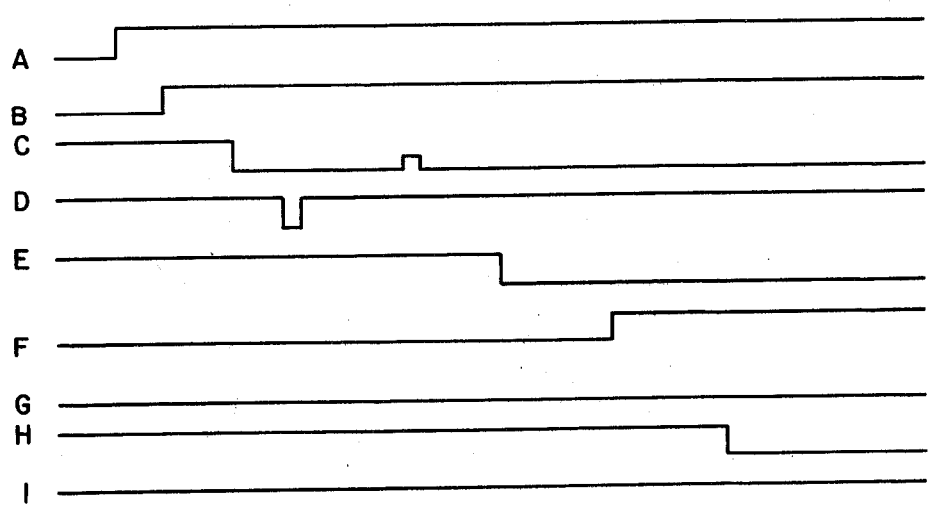

If input A goes HIGH much less than a gate delay before B, then a probability exists that a rut pulse may be produced on the output D of gate 12. This will not propagate to the output of gate 18. This is so for two reasons: (1) The delay of the difference detector 14 is about 1.5–2 times greater than for the NAND gates 10 and 12, thus holding its output, point E, HIGH during this time; (2) By the nature of the design the difference detector 14 is insensitive to rut pulses and tends to reduce them, through integration, to a level that subsequent gates are unable to respond to. This sequence of events is illustrated in FIG. 4.

The purpose of the inverters 20 and 22 is to keep the output of the R-S latch, constituted by the gates 10 and 12, from going from a HIGH state to a LOW state before the difference detector gate 14 returns to its initial HIGH level. Thus, if input A went HIGH before input B, output F would be HIGH and output G would be LOW. Then, if A goes LOW, C would go HIGH. C going HIGH would allow D to go LOW, in the absence of the inverters. At the same time, E goes HIGH because both of its inputs were HIGH. D goes LOW at about the same time that E goes HIGH, following which output G may go HIGH due to input D and then LOW due to HIGH input E and then HIGH again as input E goes LOW. The inverter 20, in this instance, would not let this series of events because the LOW fed from inverter 20 to input gate 12 would keep the output D of gate 12 HIGH, until the output of gate 16 went LOW, thus allowing the output of gate 14 at this time to return to its initial HIGH level.

Figure 5A:
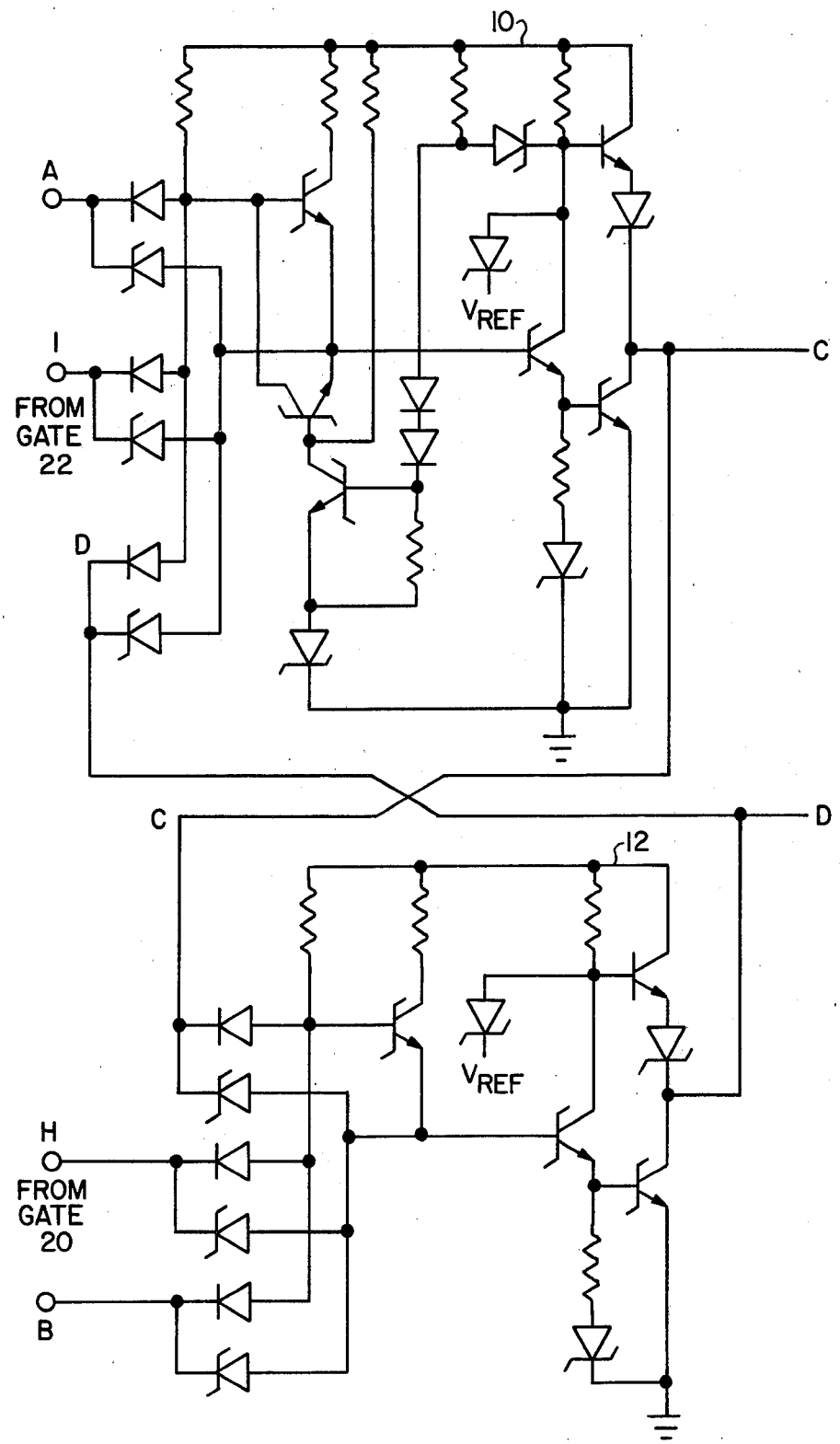
FIGS. 5a-5c comprise a detailed schematic diagram of the arbiter circuit.
Figure 5B:
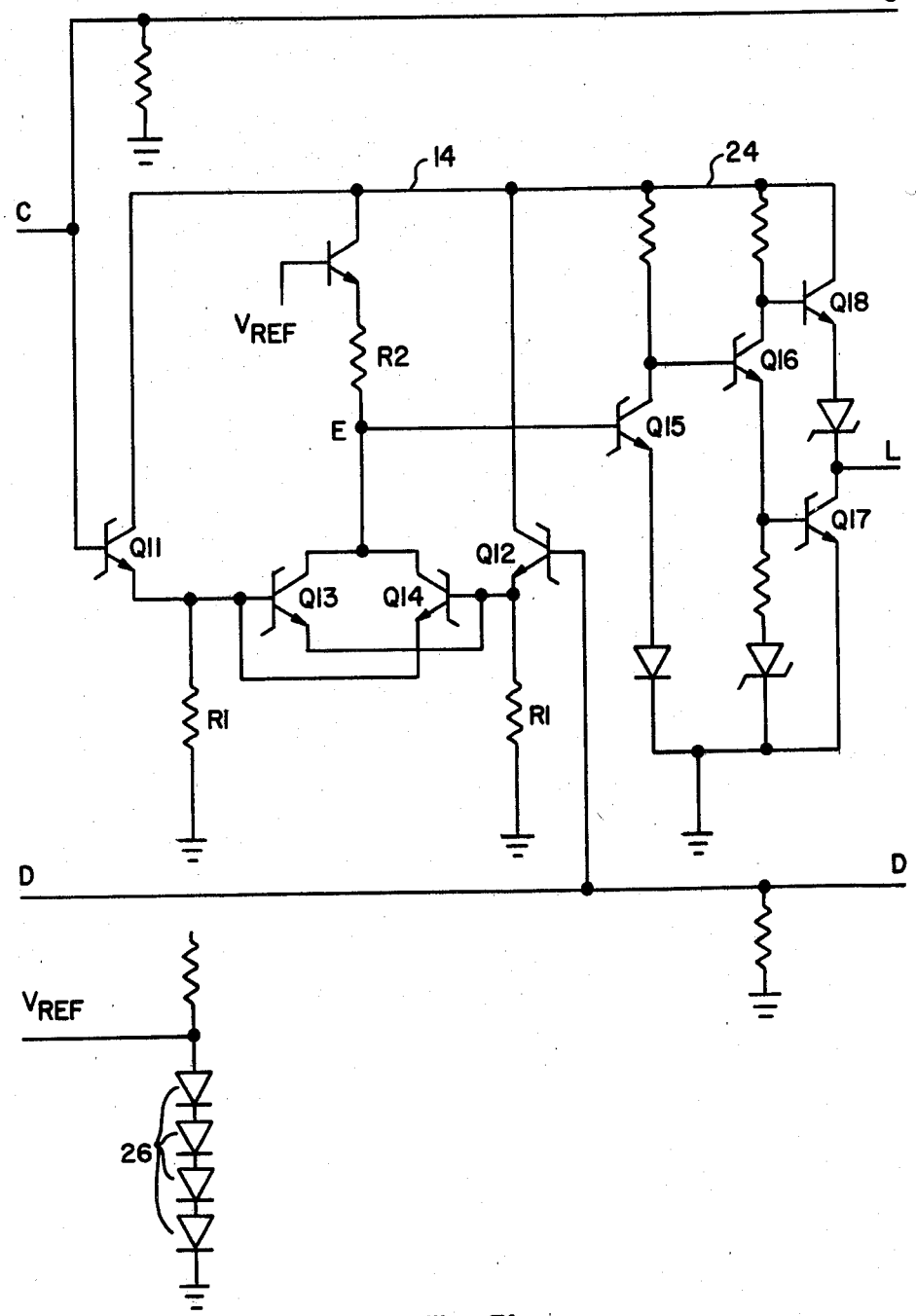
Figure 5C:
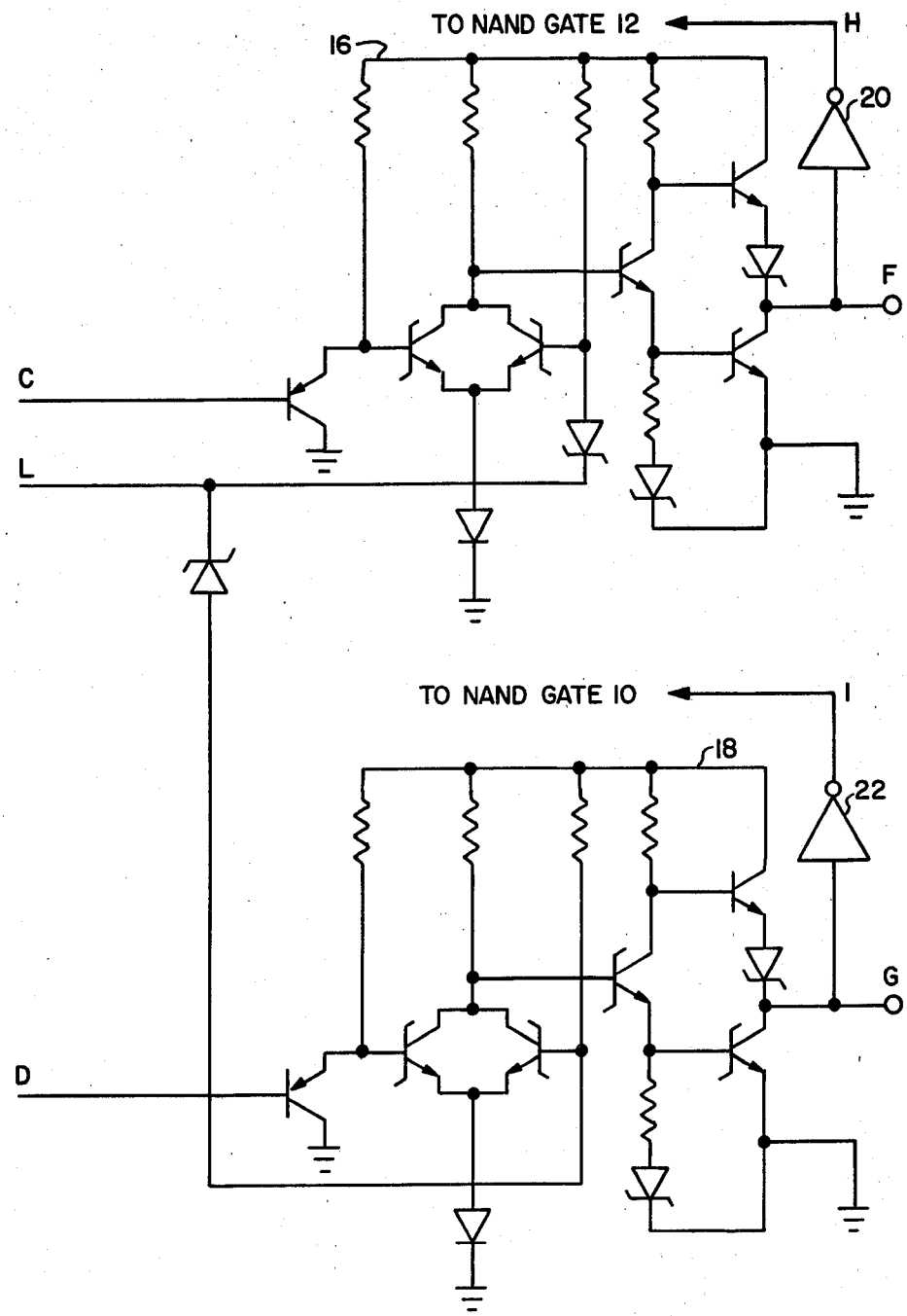

The operation of the difference detector gate 14 will be more fully described with reference to FIG. 5, which is a more detailed schematic diagram of the arbiter circuit of the invention. It will be noted that a buffer 24 is shown coupled between the output E of the difference detector gate 14 and the output NOR gates 16 and 18. The output of the buffer 24 is at node point L. First, however, it should be pointed out that the string of four diodes 26 shown connected between ground and connection point $V_{REF}$ are $V_{BE}$ clamps. They serve to limit the HIGH level on the outputs C and D of the Schmitt NAND gate 10 and NAND gate 12 to a value no greater than 3 $V_{BE}$. This has the effect of forcing a predictable voltage level into the difference detector gate 14. The diode clamps 26 also limit the HIGH level from the difference detector gate 14 into the buffer 24. This results in greater speed and also in better current level control in that it allows for a smaller value of resistor R2, which thus may be of the same material as the resistors R1 in the emitters of Q11 and Q12.

Now with the operation in the initial or normal state when both inputs A and B are LOW, the inputs C and D to the difference detector gate 14 are both HIGH. Point C is about 3 $V_{BE}$ and the emitter of transistor Q11 is about 2 $V_{BE}$. Point D is about 3 $V_{BE}$ and the emitter of transistor Q12 is about 2 $V_{BE}$. Since the emitter of transistor Q11 is connected to the base of Q13 and to the emitter of transistor Q14, and the emitter of Q12 is connected to the base of transistor Q14 and to the emitter of transistor Q13, the base emitter voltage of each of transistors Q13 and Q14 will be zero and the transistors Q13 and Q14 will thus be turned OFF. Point E will rise to 2 $V_{BE}$ to turn on Q15 of the buffer 24. Q16 will turn OFF and Q18 will turn ON, thereby causing point C to go HIGH.

Assume now that signal input A goes HIGH and input B stays LOW. Output C will be LOW and output D will be HIGH and the following will occur. Q11 is turned OFF, Q13 is turned OFF and Q12 is turned ON. The emitter of Q14 is point D$-$(2 $V_{BE}$) or about 1 $V_{BE}$. Point E will be about 2 $V_{BE}-V_{SCH}$ or about 1 volt, which is LOW, where $V_{SCH}$ is the forward voltage drop across the Schottky diode clamp of the transistor.

Assume now that input A is LOW and input B is HIGH, in which case output C is HIGH and output D is LOW. Q11 and Q13 will be turned ON and Q12 and Q14 will be turned OFF. The emitter of Q13 is point C$-$(2 $V_{BE}$) or about 1 $V_{BE}$. Point E will be about 2 $V_{BE}-V_{SCH}$ or about 1 volt, which is LOW.

In both of the above cases where the output E of the difference detector gate 14 is LOW, it will feed a LOW signal to the buffer 24. As a result, Q15 is OFF, Q16 is ON and Q17 is ON. Point L is then LOW and is about 0.25 volts.

Assume now that point C is HIGH, or about 3 $V_{BE}$ and point D is $>1$ $V_{BE}$ below point C or $<2$ $V_{BE}$. The emitter of Q11 is equal to 2 $V_{BE}$ and the emitter of Q12 is equal to 1 $V_{BE}$. Q13 is ON because its base is 1 $V_{BE}$ above the emitter, but Q14 is OFF because its base is 1 $V_{BE}$ below the emitter. Point E will be LOW.

The input latch consisting of gates 10 and 12 may be either two standard NAND gates or one standard NAND gate and one Schmitt NAND gate. It was found by experiment that the combination of one standard NAND and one Schmitt NAND had a lower probability of going into the metastable state than did the combination of two standard NAND gates. It was also found by experimentation that the use of two Schmitt NAND gates tended to oscillate easily. For the above reasons it is preferred to form the latch with one standard NAND gate and one standard Schmitt NAND gate as shown and described.

What is claimed is:

1. An arbiter circuit, comprising:
   (a) first and second input terminals and first and second output terminals;
   (b) first and second cross-coupled NAND gates coupled to said first and second input terminals, respectively;
   (c) a difference detector gate coupled to the outputs of said cross-coupled NAND gates and responsive to a voltage difference exceeding a specified amount;
   (d) first and second NOR gates having their outputs coupled to said first and second output terminals, respectively;
   (e) means coupling a first input of each of said NOR gates to the output of said difference detector gate, and
   (f) means coupling the output of said first NAND gate to a second input of said first NOR gate and coupling the output of said second NAND gate to a second input of said second NOR gate.

2. The invention according to claim 1, wherein one of said NAND gates comprises a Schmitt trigger NAND gate.

3. The invention according to claim 1, and further including:
   (g) a first inverter coupled to feed back a signal from the output of said first NOR gate to a third input of said second NAND gate, and
   (h) a second inverter coupled to feed back a signal from the output of said second NOR gate to a third input of said first NAND gate.

4. The invention according to claim 1, wherein said difference detector gate is responsive to a voltage difference of about 1 $V_{BE}$.

* * * * *